(12) United States Patent
Lin et al.

(10) Patent No.: US 12,336,276 B2
(45) Date of Patent: Jun. 17, 2025

(54) SEMICONDUCTOR DEVICE AND FABRICATION METHOD THEREOF

(71) Applicant: Vanguard International Semiconductor Corporation, Hsinchu (TW)

(72) Inventors: Shin-Cheng Lin, Hsinchu County (TW); Chia-Ching Huang, Taoyuan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 429 days.

(21) Appl. No.: 18/097,291

(22) Filed: Jan. 16, 2023

(65) Prior Publication Data
US 2024/0243121 A1    Jul. 18, 2024

(51) Int. Cl.
*H10D 84/80*   (2025.01)
*H10D 84/01*   (2025.01)
*H10D 84/05*   (2025.01)

(52) U.S. Cl.
CPC ........... *H10D 84/811* (2025.01); *H10D 84/05* (2025.01); *H10D 84/01* (2025.01)

(58) Field of Classification Search
None
See application file for complete search history.

(56) References Cited

U.S. PATENT DOCUMENTS 11,133,246 B1 * 9/2021 Chen ................. H01L 23/49844
11,152,364 B1 * 10/2021 Lin ....................... H10D 30/475
2022/0093584 A1 * 3/2022 Lee ........................ H01L 21/765

* cited by examiner

Primary Examiner — Steven M Page
(74) Attorney, Agent, or Firm — Winston Hsu

(57) ABSTRACT

A semiconductor device includes a substrate having an active element region and a passive element region. A compound semiconductor channel layer, a compound semiconductor barrier layer and a first compound semiconductor cap layer are disposed in sequence on the substrate and located in the active element region. A gate electrode is disposed on the first compound semiconductor cap layer. A source electrode and a drain electrode are disposed on the compound semiconductor barrier layer and located on two opposite sides of the gate electrode, respectively, to construct a high electron mobility transistor. A second compound semiconductor cap layer is disposed on the substrate and located in the passive element region to construct a resistor.

20 Claims, 6 Drawing Sheets

SEMICONDUCTOR DEVICE AND FABRICATION METHOD THEREOF

BACKGROUND OF THE INVENTION

1. Field of the Invention

The present disclosure relates generally to semiconductor devices, and more particularly to semiconductor devices integrating resistors and high electron mobility transistors and fabrication methods thereof.

2. Description of the Prior Art

In alternating current/direct current (AC/DC) power conversion circuits, resistors are usually used as voltage dividers. Currently, silicon (Si) is generally used as a base material to form a channel for most semiconductor devices. In the Si-based semiconductor devices, polysilicon is usually used to form a resistor, and the polysilicon resistor is disposed on field oxide (FOX). The voltage that the polysilicon resistor can withstand is limited by the thickness of the field oxide. Moreover, when the voltages applied to two terminals of the polysilicon resistor are increased, polysilicon depletion in the polysilicon resistor will become more serious, thereby causing the change of the resistance values of the polysilicon resistor with the voltages is non-linear.

In the development of high-voltage and high-power devices, semiconductor devices using gallium nitride (GaN), for example high electron mobility transistors (HEMTs), have gradually replaced the Si-based semiconductor devices due to their attractive properties, such as low on-resistance, the ability to resist high voltage, operated at high frequency and high current, etc. However, in AC/DC power conversion circuits and other digital logic circuits, there are still many problems to be overcome in how to integrate a resistor with a high electron mobility transistor.

SUMMARY OF THE INVENTION

In view of this, the present disclosure provides a semiconductor device integrating a resistor and a high electron mobility transistor (HEMT) and a fabrication method thereof. In the semiconductor device, a compound semiconductor material layer of forming a cap layer of the HEMT is used to construct the resistor in a passive element region without additional processes and photomasks to complete the semiconductor device integrating the resistor and the HEMT.

According to an embodiment of the present disclosure, a semiconductor device is provided and includes a substrate, a compound semiconductor channel layer, a compound semiconductor barrier layer, a first compound semiconductor cap layer, a gate electrode, a source electrode, a drain electrode, and a second compound semiconductor cap layer. The substrate includes an active element region and a passive element region. The compound semiconductor channel layer, the compound semiconductor barrier layer and the first compound semiconductor cap layer are disposed in sequence on the substrate and located in the active element region. The gate electrode is disposed on the first compound semiconductor cap layer. The source electrode and the drain electrode are disposed on the compound semiconductor barrier layer and respectively located on two opposite sides of the gate electrode to construct a high electron mobility transistor. In addition, the second compound semiconductor cap layer is disposed on the substrate and located in the passive element region to construct a resistor.

According to an embodiment of the present disclosure, a method of fabricating a semiconductor device is provided and includes the following steps. A substrate is provided and includes an active element region and a passive element region. A semiconductor channel layer, a compound semiconductor barrier layer, and a compound semiconductor cap layer are formed in sequence on the substrate and in the active element region and the passive element region. An isolation region is formed in the compound semiconductor channel layer of the passive element region. The compound semiconductor cap layer is patterned to form a first compound semiconductor cap layer in the active element region, and a second compound semiconductor cap layer in the passive element region. The second compound semiconductor cap layer constructs a resistor. A gate electrode is formed on the first compound semiconductor cap layer. In addition, a source electrode and a drain electrode are formed on the compound semiconductor barrier layer and respectively located on two opposite sides of the gate electrode to construct a high electron mobility transistor.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
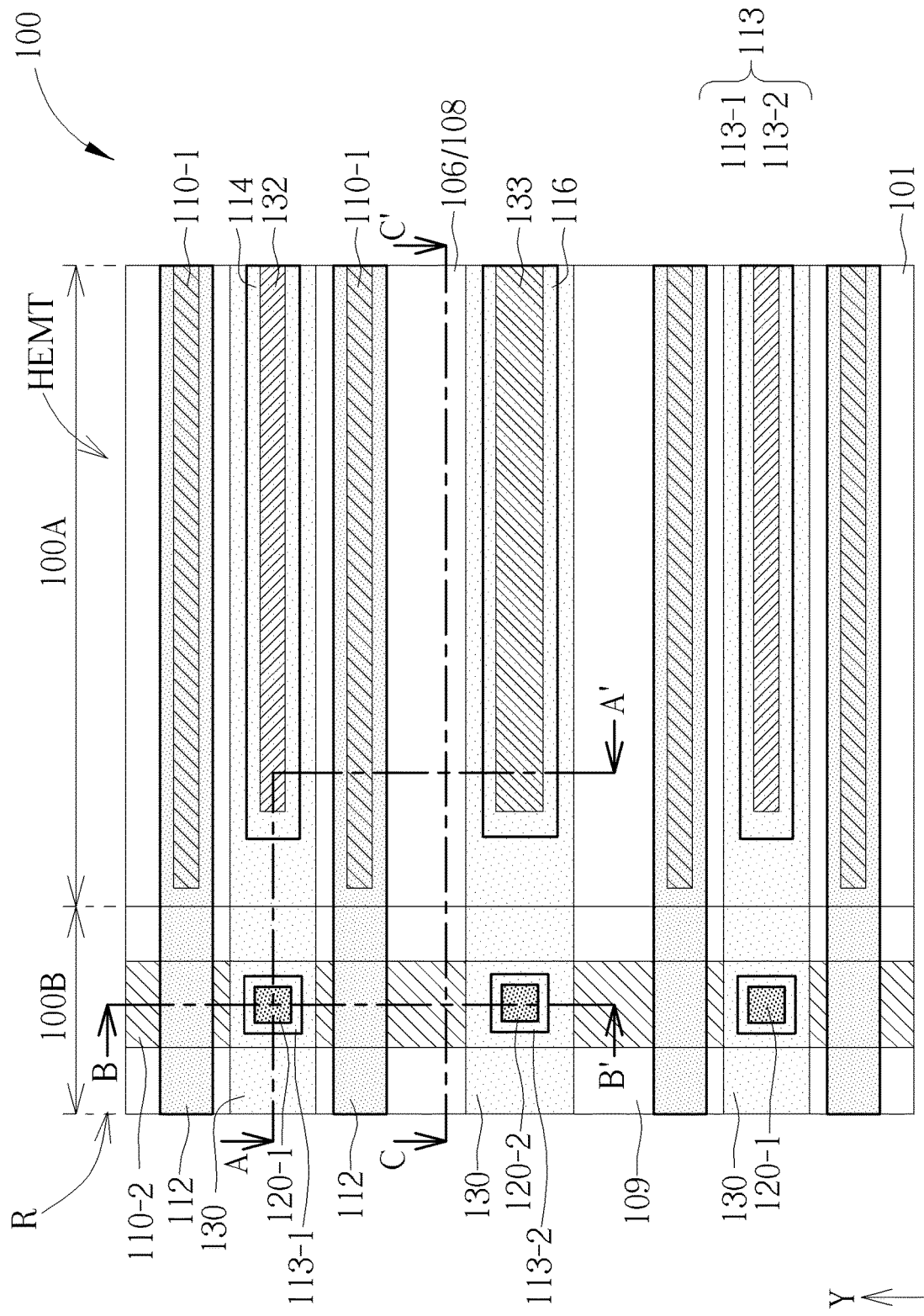
FIG. 1 is a schematic top view of a semiconductor device according to an embodiment of the disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

In the present disclosure, a "compound semiconductor" refers to a group III-V compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), AlGaAs, InAlAs, InGaAs, or the like, or the combination thereof. Besides, based on different requirements, compound semiconductor may contain dopants to become semiconductor with specific conductivity type, such as n-type or p-type.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure is directed to semiconductor devices integrating resistors and high electron mobility transistors (HEMT) and fabrication methods thereof. In the semiconductor devices, a compound semiconductor material layer of forming a cap layer of a HEMT, such as a gallium nitride (GaN) layer, having high-resistance characteristic is used to form a resistor in a passive element region. Moreover, an epitaxial growth process and a patterning process are used to form a first compound semiconductor cap layer of the HEMT in an active element region and also form a second compound semiconductor cap layer in a passive element region to construct a resistor without additional process steps and photomasks.

Furthermore, the resistors of the embodiments of the present disclosure may have different resistance values by adjusting the aspect ratios or the meandering shapes of the compound semiconductor cap layer in the passive element region. The resistors may be electrically connected in parallel and/or in series with HEMTs and/or other components HEMTs and/or other components such as Zener diodes to form semiconductor devices. Compared with the conventional semiconductor devices using polysilicon resistors, according to the semiconductor devices of the present disclosure, the fabrication of the resistors is compatible with the processes of the HEMTs, thereby achieving the benefits of saving process steps and manufacturing costs. Meanwhile, according to the semiconductor devices of the present disclosure, since the resistor in the passive element region is formed by using the material of a compound semiconductor cap layer of the HEMT, the resistance value of the resistor is stable and easy controlled. Moreover, the resistance value of the resistor is not affected by the concentration of two-dimensional electron gas (2DEG) in the channel layer of the HEMT. Therefore, in the embodiments of the present disclosure, the resistors are suitable for applications in high-voltage and high-power AC/DC power conversion circuits and other digital logic circuits.

FIG. 1 is a schematic top view of a semiconductor device 100 integrating a resistor R and a high electron mobility transistor HEMT according to an embodiment of the present disclosure. A substrate 101 of the semiconductor device 100 includes an active element region 100A and a passive element region 100B. The high electron mobility transistor HEMT is located in the active element region 100A, and the resistor R is located in the passive element region 100B. The high electron mobility transistor HEMT of the semiconductor device 100 includes a compound semiconductor channel layer (hereinafter referred to as a channel layer) 106 and a compound semiconductor barrier layer (hereinafter referred to as a barrier layer) 108 disposed on the substrate 101. In addition, a first compound semiconductor cap layer (hereinafter referred to as a first cap layer) 110-1 and a gate electrode 112 are disposed on the barrier layer 108. A source electrode 114 and a drain electrode 116 are also disposed on the barrier layer 108, and respectively located on two opposite sides of the gate electrode 112. As shown in FIG. 1, the long axes of the first cap layer 110-1, the gate electrode 112, the source electrode 114, and the drain electrode 116 all are extended along a first direction (for example, the X-axis direction), and arranged along a second direction (for example, the Y-axis direction). In one embodiment, the top-view layout of the high electron mobility transistor HEMT is in such a way that two gate electrodes 112 are respectively located on the upper and lower sides of the source electrode 114, and the drain electrode 116 is a common drain. Moreover, the distance between the drain electrode 116 and the gate electrode 112 is greater than the distance between the source electrode 114 and the gate electrode 112. Furthermore, a source contact 132 is disposed on the source electrode 114, and a drain contact 133 is disposed on the drain electrode 116.

According to the embodiments of the present disclosure, a second compound semiconductor cap layer (hereinafter referred to as a second cap layer) 110-2 is disposed on the substrate 101 and located in the passive element region 100B to construct the resistor R. The long axis of the second cap layer 110-2 is extended along the second direction (for example, the Y-axis direction). The extension direction of the second cap layer 110-2 is different from the extension direction of the first cap layer 110-1. In some embodiments, the channel layer 106 and the barrier layer 108 of the semiconductor device 100 may be continuously extended from the active element region 100A to the passive element region 100B. The semiconductor device 100 further includes an isolation region 109 disposed in the channel layer 106 of the passive element region 100B. The second cap layer 110-2 is disposed on the barrier layer 108 of the passive element region 100B. In addition, the semiconductor device 100 also includes a patterned conductive layer 113 disposed directly above the second cap layer 110-2. The patterned conductive layer 113 and the gate electrode 112 may be formed by patterning the same conductive material layer. The semiconductor device 100 also includes a plurality of contacts, such as a first contact 120-1 and a second contact 120-2, disposed directly above a first portion 113-1 and a second portion 113-2 of the patterned conductive layer 113, respectively. In some embodiments, the first contact 120-1 is electrically connected to the second cap layer 110-2, and further electrically connected to the source electrode 114 through a wire layer 130 and the source contact 132. The second contact 120-2 is also electrically connected to the second cap layer 110-2, and further electrically connected to the drain electrode 116 through another wire layer 130 and the drain contact 133. Accordingly, the resistor R is electrically connected in parallel with the high electron mobility transistor HEMT. In other embodiments, the semiconductor device 100 further includes other contacts disposed directly above other portions of the patterned conductive layer 113, so that the resistor R is electrically connected in series and/or in parallel with other components, such as other HEMTs and/or Zener diodes through these contacts and other wire layers.

Figure 2:
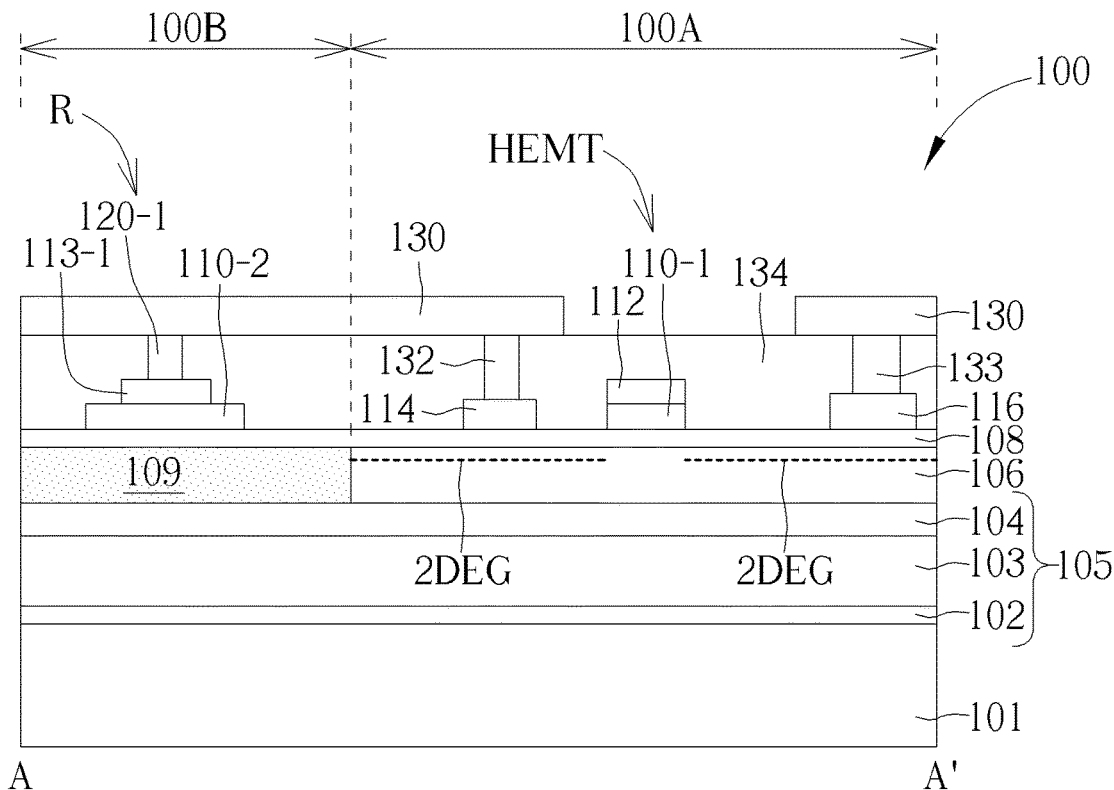
FIG. 2 is a schematic cross-sectional view of a semiconductor device along the line A-A' in FIG. 1 according to an embodiment of the present disclosure.

FIG. 2 is a schematic cross-sectional view of a semiconductor device 100 along the line A-A' in FIG. 1 according to an embodiment of the present disclosure. In some embodiments, the semiconductor device 100 may include an epitaxial stacking layer 105 disposed on the substrate 101. The epitaxial stacking layer 105 is continuously formed in the active element region 100A and the passive element region 100B. The material of the substrate 101 may include ceramics, silicon carbide (SiC), aluminum nitride (AlN), sapphire or silicon. In addition, the substrate 101 may be a semiconductor on insulator (SOI) substrate. Alternatively, the substrate 101 may be provided by a composite substrate (or referred to as a QST substrate) composed of a core substrate wrapped around by a composite material layer. The core substrate includes ceramics, silicon carbide, aluminum nitride, sapphire or silicon. The composite material layer includes an insulating material layer and a semiconductor material layer, where the insulating material layer may be single or multiple layers of silicon oxide, silicon nitride or silicon oxynitride, and the semiconductor material layer may be silicon or polysilicon. In addition, during the fabrication of the semiconductor devices, the composite material layer on the backside of the core substrate may be removed by a thinning process, such as a grinding or etching process, so that the backside of the core substrate is exposed. In some embodiments, the epitaxial stacking layer 105 may include a nucleation layer 102, a buffer layer 103 and a high resistance layer (or referred to as an electrical isolation layer) 104 stacked in sequence from bottom to top. In some embodiments, the nucleation layer 102 is, for example, an aluminum nitride (AlN) layer. The buffer layer 103 may be a superlattice (SL) structure including a plurality of alternately stacked aluminum gallium nitride (AlGaN) layers and aluminum nitride (AlN) layers. The high resistance layer 104 is, for example, a carbon-doped gallium nitride (C—GaN) layer. The compositions of the aforementioned layers are for example, but not limited thereto.

In addition, as shown in FIG. 2, the high electron mobility transistor HEMT of the semiconductor device 100 includes a channel layer 106 disposed on the high resistance layer 104, a barrier layer 108 stacked on the channel layer 106, and a first cap layer 110-1 disposed on the barrier layer 108. A gate electrode 112 is disposed on the first cap layer 110-1. A source electrode 114 and a drain electrode 116 are disposed on the barrier layer 108, and respectively located on two opposite sides of the gate electrode 112. Since there is a discontinuous energy gap between the materials of the channel layer 106 and the barrier layer 108, by stacking the channel layer 106 with the barrier layer 108, electrons are gathered on the heterojunction between the channel layer 106 and the barrier layer 108 due to the piezoelectric effect, thereby generating a thin layer with high electron mobility, i.e., a two-dimensional electron gas region 2DEG in the channel layer 106. Moreover, as shown in FIG. 2, for an enhancement-mode (E-mode) (or referred to as normally off) HEMT, when no positive voltage is applied to the gate electrode 112, the region covered by the first cap layer 110-1 will not form two-dimensional electron gas, which is regarded as a 2DEG cut-off region, so that there is no conduction between the source electrode 114 and the drain electrode 116.

In some embodiments, the channel layer 106 is, for example, an undoped gallium nitride (u-GaN) layer, and the barrier layer 108 is a compound semiconductor layer with an energy gap greater than that of the channel layer 106, for example, the barrier layer 108 may be an aluminum gallium nitride (AlGaN) layer. The first cap layer 110-1 is, for example, a p-type gallium nitride (p-GaN) layer. The compositions of the aforementioned layers are for example, but not limited thereto. The compositions and structural arrangements of the aforementioned compound semiconductor layers of the high electron mobility transistor HEMT may be adjusted and determined based on the requirements of various semiconductor devices. In addition, the materials of the gate electrode 112, the source electrode 114 and the drain electrode 116 may include metal, alloy, metal nitride or semiconductor material (for example, polysilicon). In some embodiments, the metal includes gold (Au), nickel (Ni), platinum (Pt), palladium (Pd), iridium (Ir), titanium (Ti), chromium (Cr), tungsten (W), aluminum (Al), copper (Cu), molybdenum (Mo), other suitable conductive metal materials, or a combination thereof. Moreover, the gate electrode 112 may form a Schottky contact with the first cap layer 110-1. The source electrode 114 and the drain electrode 116 may form an Ohmic contact with the underlying barrier layer 108 and the channel layer 106. Furthermore, as shown in FIG. 2, the source electrode 114 and the drain electrode 116 may be electrically connected to different wire layers 130 through the source contact 132 and the drain contact 133, respectively. The source contact 132 and the drain contact 133 are formed in an interlayer dielectric (ILD) layer 134. The wire layers 130 are formed on the interlayer dielectric layer 134. The source contact 132, the drain contact 133 and the wire layers 130 are formed of conductive materials, such as tungsten (W), copper (Cu), aluminum (Al) or other suitable conductive materials.

As shown in FIG. 2, in one embodiment, the channel layer 106 and the barrier layer 108 may be continuously extended from the active element region 100A to the passive element region 100B. The isolation region 109 is disposed in the channel layer 106 of the passive element region 100B, so that there is no two-dimensional electron gas (2DEG) generated in the passive element region 100B. The second cap layer 110-2 for constructing the resistor R is disposed on the barrier layer 108. The first portion 113-1 of the patterned conductive layer 113 is disposed on the second cap layer 110-2. The first contact 120-1 is disposed directly above the first portion 113-1 of the patterned conductive layer 113. In one embodiment, the wire layer 130 is continuously extended from the passive element region 100B to the active element region 100A. The second cap layer 110-2 is electrically connected to the source electrode 114 through the first portion 113-1 of the patterned conductive layer 113, the first contact 120-1, the wire layer 130 and the source contact 132. In another embodiment, the wire layer 130 on the first contact 120-1 is separated from another wire layer 130 on the source contact 132. These separate wire layers 130 are electrically connected with each other through another wire layer above the wire layers 130 to complete the electrical connection between the second cap layer 110-2 and the source electrode 114. Moreover, in one embodiment, the patterned conductive layer 113 on the second cap layer 110-2 and the gate electrode 112 in the active element region 100A may be formed by patterning the same conductive material layer. The patterned conductive layer 113 may form a Schottky contact with the second cap layer 110-2. In another embodiment, the patterned conductive layer 113 may form an Ohmic contact with the second cap layer 110-2 by selecting the material of the patterned conductive layer 113. In some embodiments, a bias voltage may be applied to the patterned conductive layer 113 for adjusting the electrical properties of the resistor R in the passive element region 100B. The resistance value of the Schottky contact under a low bias voltage will be higher than that under a high bias voltage. The range of the low bias voltage is small, such as from 0V to 25V. Therefore, while there is no 2DEG in the region directly under the resistor R, the electrical property adjustment of the resistor R is mainly achieved by changing the top-view layout of the second cap layer 110-2, or changing the doping concentration or the dopant type of the second cap layer 110-2.

According to some embodiments of the present disclosure, the epitaxial stacking layer 105 may be formed on the substrate 101 by an epitaxial growth process. In addition, the channel layer 106, the barrier layer 108 and a compound semiconductor cap layer are deposited in sequence on the epitaxial stacking layer 105 in both the active element region 100A and the passive element region 100B. In one embodiment, before depositing the barrier layer 108 and the compound semiconductor cap layer, an isolation region 109 is formed in the channel layer 106 of the passive element region 100B. Then, by using the same patterning process (such as photolithography and etching processes), the portions of the compound semiconductor cap layer located in the active element region 100A and the passive element region 100B are simultaneously patterned to form the first cap layer 110-1 in the active element region 100A and the second cap layer 110-2 in the passive element region 100B. In some embodiments of the present disclosure, the compositions of the first cap layer 110-1 and the second cap layer 110-2 may be the same with each other, for example, both are formed of p-type gallium nitride (p-GaN). Moreover, the first cap layer 110-1 and the second cap layer 110-2 may have the same doping concentration of p-type dopant. Therefore, the first cap layer 110-1 and the second cap layer 110-2 may be formed simultaneously through the same epitaxial growth process and the same patterning process. In addition, during the epitaxial growth process, p-type dopants of the same doping concentration may be implanted into the epitaxial material of the compound semiconductor cap layer in both the active element region 100A and the passive element region 100B.

Furthermore, in other embodiments, the compositions of the first cap layer 110-1 and the second cap layer 110-2 may be different from each other, for example, the first cap layer 110-1 may be formed of p-type gallium nitride (p-GaN), and the second cap layer 110-2 may be formed of gallium nitride, n-type gallium nitride or p-type gallium nitride, where the doping concentration of the p-type dopant in the second cap layer 110-2 may be different from the doping concentration of the p-type dopant in the first cap layer 110-1. In these embodiments, the first cap layer 110-1 and the second cap layer 110-2 may be deposited by the same epitaxial growth process. During the epitaxial growth process, p-type dopants of different doping concentrations may be implanted into the epitaxial material in the active element region 100A and the passive element region 100B, respectively. Alternatively, different dopants, such as p-type and n-type dopants, may be implanted into the epitaxial material in the active element region 100A and the passive element region 100B, respectively. Then, the portions of the compound semiconductor cap layer in the active element region 100A and the passive element region 100B are patterned by the same patterning process to form the first cap layer 110-1 and the second cap layer 110-2 at the same time.

Figure 3:
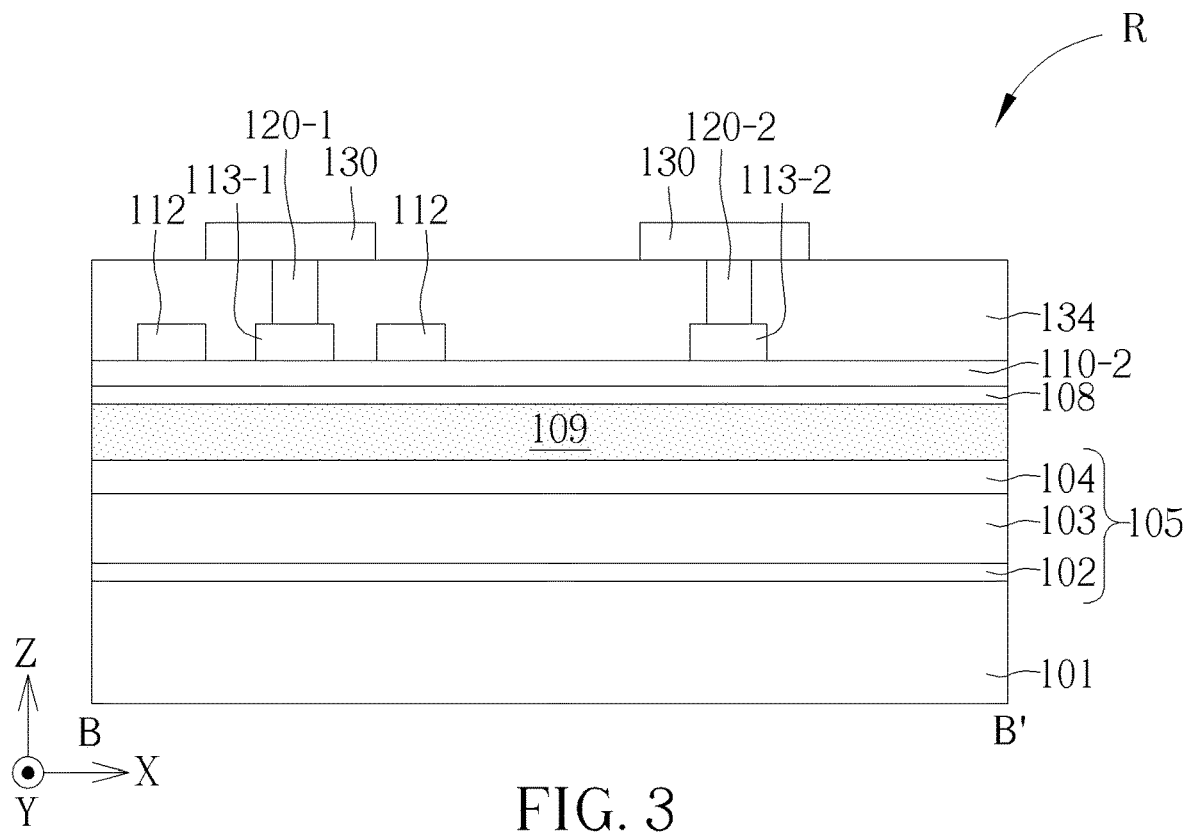
FIG. 3 is a schematic cross-sectional view of a resistor of a semiconductor device along the line B-B' in FIG. 1 according to an embodiment of the present disclosure.

FIG. 3 is a schematic cross-sectional view of a resistor R of a semiconductor device 100 along the line B-B' in FIG.

1 according to an embodiment of the present disclosure. A gate electrode 112, a first portion 113-1 of a patterned conductive layer 113, another gate electrode 112, and a second portion 113-2 of the patterned conductive layer 113 are arranged in sequence along the Y-axis on the second cap layer 110-2 of the resistor R. A first contact 120-1 is disposed directly above the first portion 113-1 of the patterned conductive layer 113. A second contact 120-2 is disposed directly above the second portion 113-2 of the patterned conductive layer 113. A first contact 120-1 and a second contact 120-2 are formed to pass through an interlayer dielectric (ILD) layer 134 and respectively electrically connected to separate wire layers 130. In this embodiment, the second cap layer 110-2 for the resistor R may be electrically coupled to other components through these contacts and multiple wire layers. The other components are such as HEMTs, Zener diodes and/or other components in AC/DC power conversion circuits and other digital logic circuits. In addition, since there is no two-dimensional electron gas generated in the passive element region 100B, the passive element region 100B may be regarded as a 2DEG cut-off region. Accordingly, the current from a wire layer 130 may enter the second cap layer 110-2 through the second contact 120-2, transmit in the second cap layer 110-2 to generate a required voltage drop, and then the current enters another wire layer 130 through the first contact 120-1.

Figure 4:
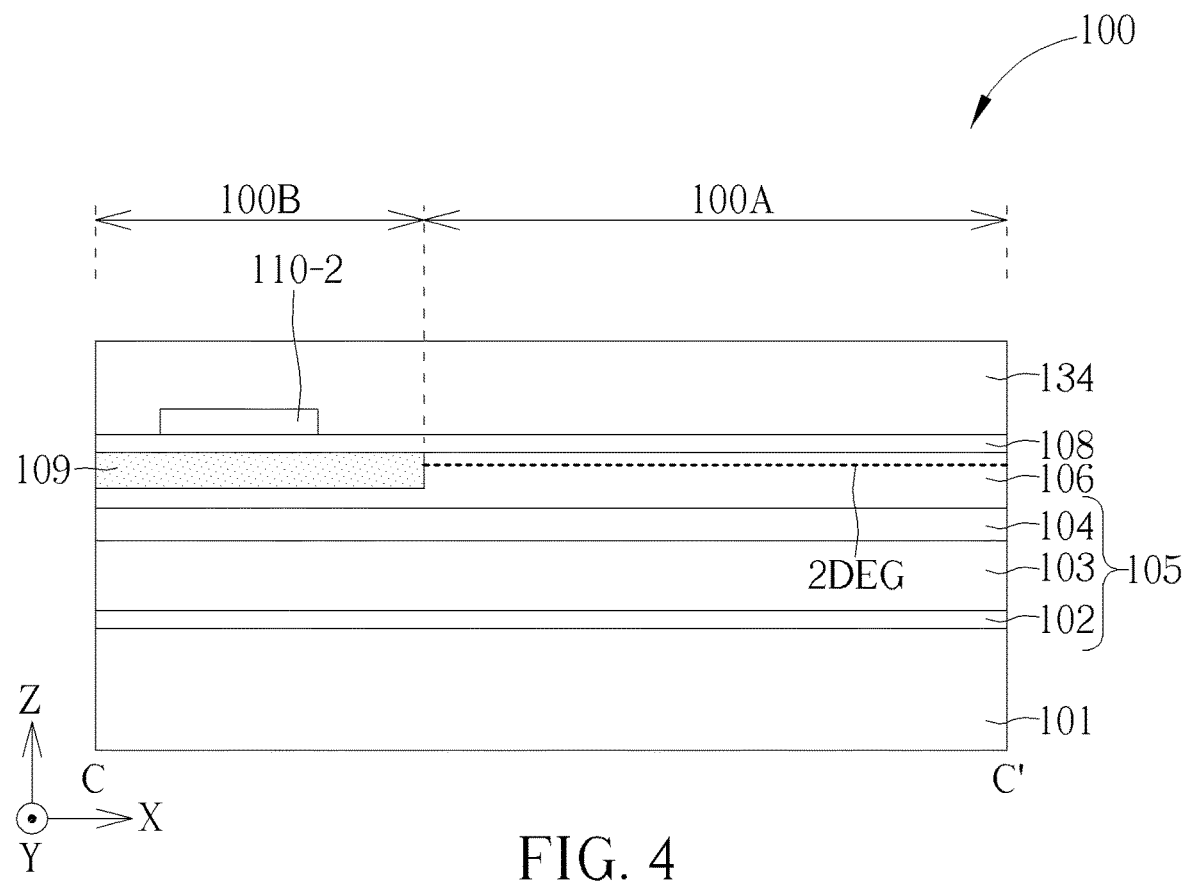
FIG. 4 is a schematic cross-sectional view of a semiconductor device along the line C-C' in FIG. 1 according to an embodiment of the present disclosure.

FIG. 4 is a schematic cross-sectional view of a semiconductor device 100 along the line C-C' in FIG. 1 according to an embodiment of the present disclosure. The line C-C' passes through the second cap layer 110-2 in the passive element region 100B, and passes through the channel layer 106 and the barrier layer 108 in the active element region 100A, but does not pass through the source electrode, the gate electrode and the drain electrode in the active element region 100A, so as to illustrate the structural differences of the channel layer 106 and the barrier layer 108 between the passive element region 100B and the active element region 100A. As shown in FIG. 4, in one embodiment, an isolation region 109 is disposed in the channel layer 106 of the passive element region 100B, so that there is no two-dimensional electron gas (2DEG) generated in the passive element region 100B. In one embodiment, before forming the barrier layer 108, inert ions such as nitrogen, oxygen, or a combination thereof, may be implanted into the channel layer 106 by an ion implantation process, thereby destroying the lattice structure of the channel layer 106 to generate a high-resistance region for forming the isolation region 109 (also referred to as an inert ion implantation region). The bottom surface of the isolation region 109 may be higher than or level with the bottom surface of the channel layer 106. The height of the bottom surface of the isolation region 109 may be determined by the energy of the ion implantation process. In this embodiment, the second cap layer 110-2 in the passive element region 100B is disposed on the barrier layer 108.

Figure 5:
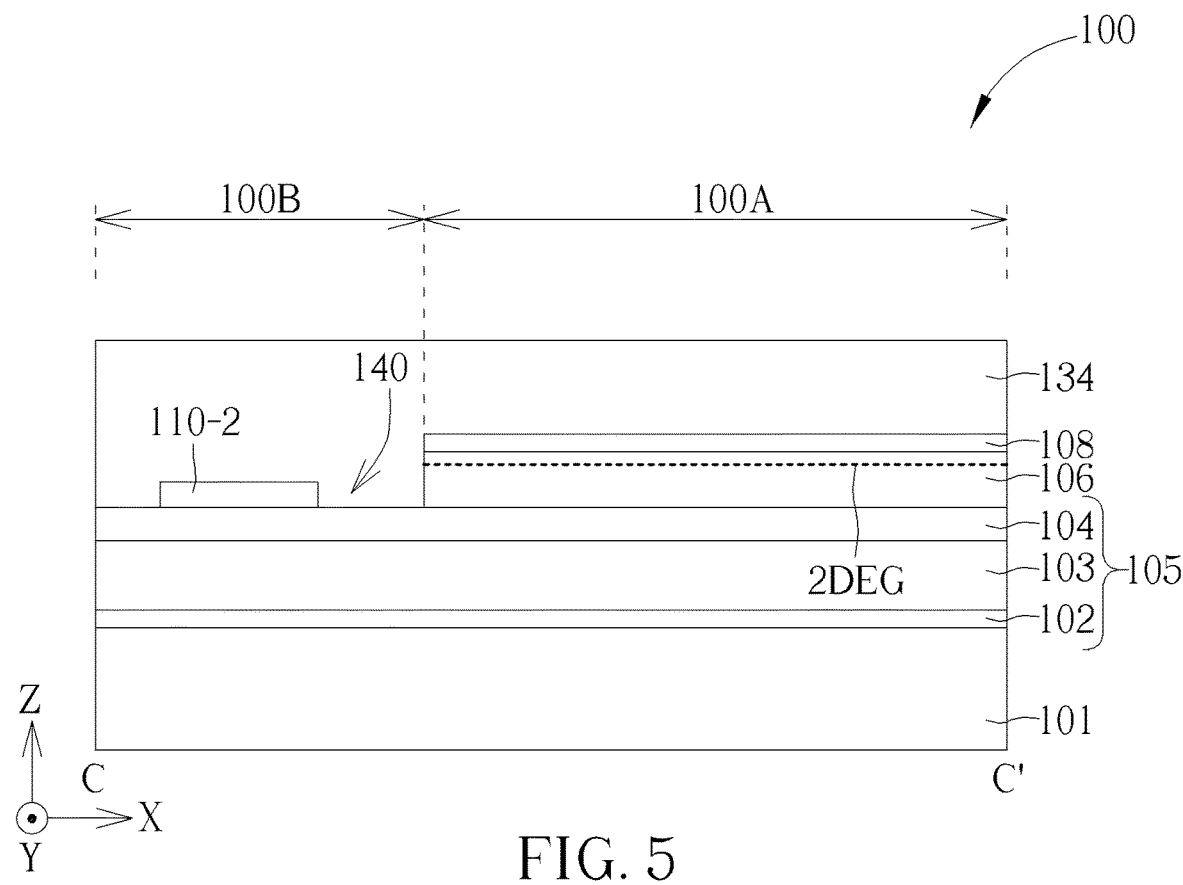
FIG. 5 is a schematic cross-sectional view of a semiconductor device along the line C-C' in FIG. 1 according to another embodiment of the present disclosure.

FIG. 5 is a schematic cross-sectional view of a semiconductor device 100 along the line C-C' in FIG. 1 according to another embodiment of the present disclosure. In this embodiment, the barrier layer 108 and all the channel layers 106 in the passive element region 100B are removed by an etching process to form a recess 140. There is no two-dimensional electron gas generated in the passive element region 100B due to the recess 140. As shown in FIG. 5, in one embodiment, the bottom surface of the recess 140 may be level with the bottom surface of the channel layer 106. The depth of the recess 140 is determined by the parameters of the etching process. In this embodiment, the second cap layer 110-2 in the passive element region 100B is disposed in the recess 140 and located on the bottom surface of the recess 140. The second cap layer 110-2 for the resistor R may be directly formed on the epitaxial stacking layer 105, and the bottom surface of the second cap layer 110-2 is in contact with the top surface of the epitaxial stacking layer 105.

Figure 6:
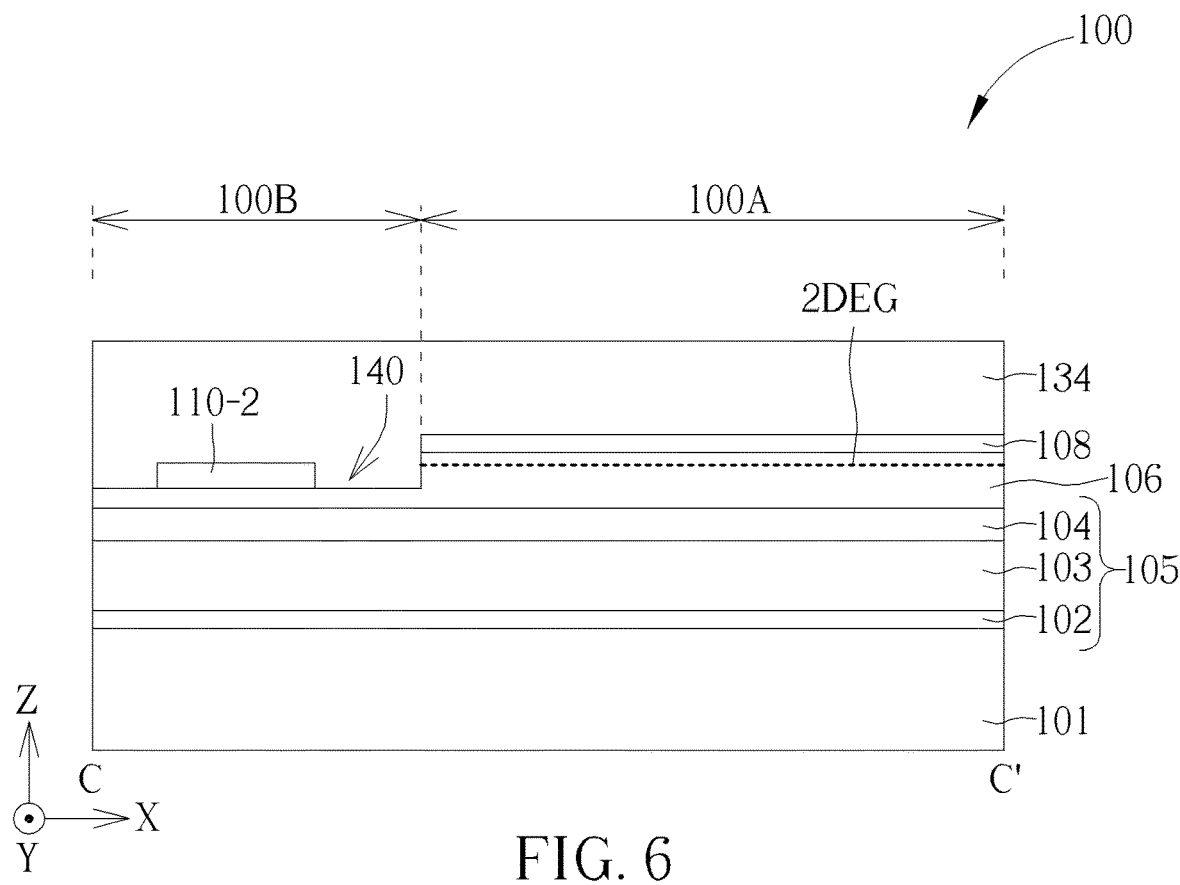
FIG. 6 is a schematic cross-sectional view of a semiconductor device along the line C-C' in FIG. 1 according to further another embodiment of the present disclosure.

FIG. 6 is a schematic cross-sectional view of a semiconductor device 100 along the line C-C' in FIG. 1 according to further another embodiment of the present disclosure. In this embodiment, the barrier layer 108 and a portion of the channel layer 106 in the passive element region 100B are removed by an etching process to form a recess 140. There is no two-dimensional electron gas generated in the passive element region 100B due to the recess 140. As shown in FIG. 6, in one embodiment, the bottom surface of the recess 140 may be higher than the bottom surface of the channel layer 106. The depth of the recess 140 is determined by the parameters of the etching process. In this embodiment, the second cap layer 110-2 in the passive element region 100B is disposed in the recess 140 and located on the bottom surface of the recess 140.

Figure 7:
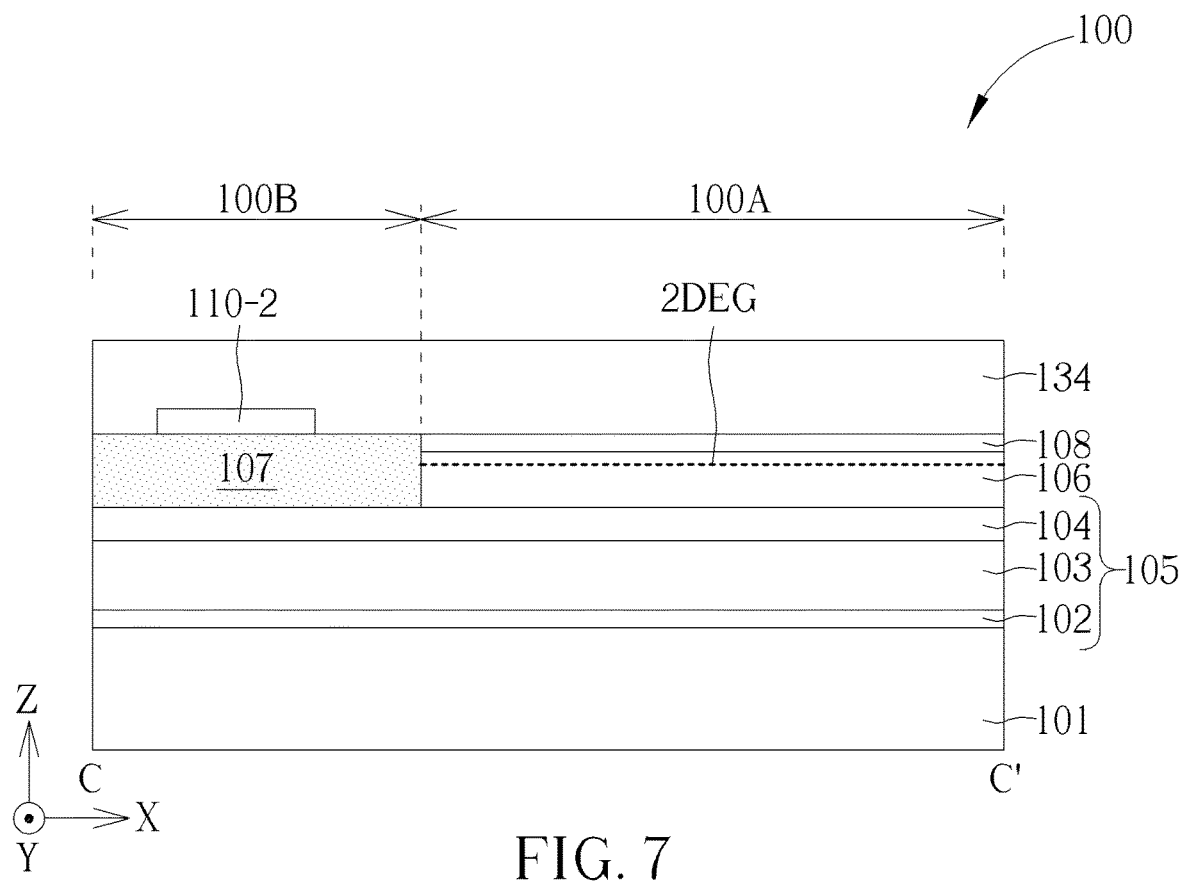
FIG. 7 is a schematic cross-sectional view of a semiconductor device along the line C-C' in FIG. 1 according to yet another embodiment of the present disclosure.

FIG. 7 is a schematic cross-sectional view of a semiconductor device 100 along the line C-C' in FIG. 1 according to another embodiment of the present disclosure. In this embodiment, a shallow trench isolation (STI) region 107 is disposed in both the barrier layer 108 and the channel layer 106 in the passive element region 100B, so that there is no two-dimensional electron gas generated in the passive element region 100B. In this embodiment, a trench is firstly formed in the barrier layer 108 and the channel layer 106 of the passive element region 100B by an etching process. The bottom surface of the trench may be higher than or level with the bottom surface of the channel layer 106. The height of the bottom surface of the trench is determined by the etching process. Then, the trench is filled up with a dielectric material such as silicon oxide, silicon nitride, silicon oxynitride or other suitable dielectric materials to form the STI region 107. In this embodiment, the second cap layer 110-2 in the passive element region 100B for the resistor R may be formed on the STI region 107. For example, the bottom surface of the second cap layer 110-2 may be in contact with the top surface of the STI region 107, thereby increasing the resistance value of the resistor R of the semiconductor device 100.

In some embodiments of the present disclosure, the resistance value of the isolation region 109 (or referred to as an ion implantation region) or the STI region 107 directly under the second cap layer 110-2 is higher than the resistance value of the channel layer 106, thereby increasing the resistance value of the resistor R through the isolation region 109 or the STI region 107.

Figure 8:
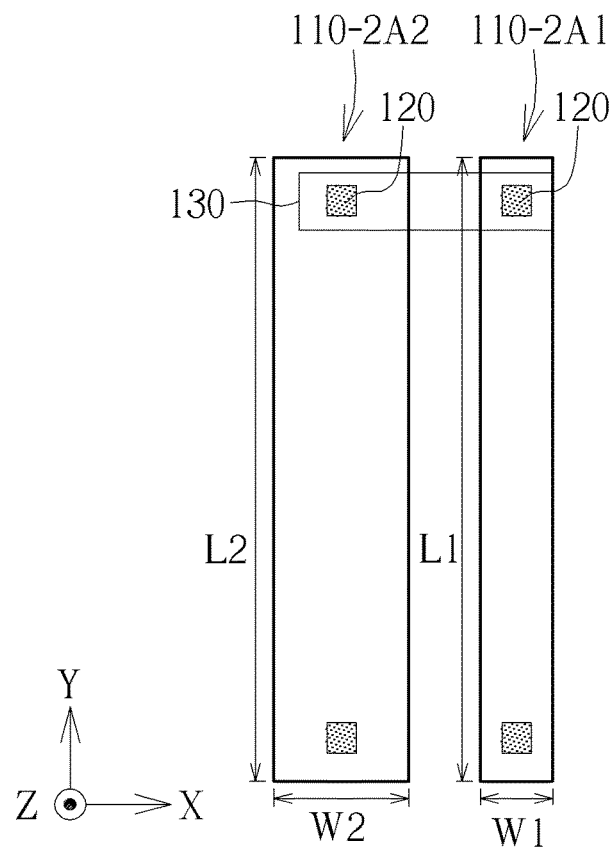
FIG. 8 is a schematic top view of a resistor of a semiconductor device according to an embodiment of the disclosure.

FIG. 8 is a schematic top view of a resistor R of a semiconductor device 100 according to an embodiment of the present disclosure. In this embodiment, the top-view shape of the resistor R of the semiconductor device 100 may be constituted of multiple strips 110-2A1 and 110-2A2. The strip-shaped resistor R may have different resistance values by adjusting the aspect ratios of the multiple strips. For example, the length L1 of the strip 110-2A1 is substantially equal to the length L2 of the strip 110-2A2. The width W1 of the strip 110-2A1 is smaller than the width W2 of the strip 110-2A2. The aspect ratio L1/W1 of the strip 110-2A1 is greater than the aspect ratio L2/W2 of the strip 110-2A2. Accordingly, the resistance value of a resistor with the top-view shape of the strip 110-2A1 is greater than the resistance value of another resistor with the top-view shape of the strip 110-2A2. Furthermore, referring to FIG. 1 and FIG. 8, in some embodiments, in addition to the second cap layer 110-2, a third compound semiconductor cap layer (hereinafter referred to as a third cap layer) may be formed on the substrate 101 in the passive element region 100B to construct another resistor. The top-view shape of the second cap layer 110-2 is, for example, the strip 110-2A1 as shown in FIG. 8, and the top-view shape of the third cap layer is, for example, the strip 110-2A2 as shown in FIG. 8, so that the third cap layer and the second cap layer 110-2 have different resistance values.

In some embodiments, the compositions of the third cap layer and the second cap layer 110-2 in the passive element region 100B and the first cap layer 110-1 in the active element region 100A may be the same with each other. Moreover, the first cap layer 110-1, the second cap layer 110-2 and the third cap layer may be formed simultaneously by the same epitaxial growth process and the same patterning process. In addition, as shown in FIG. 8, multiple contacts 120 may be formed directly above the strip 110-2A2 of the third cap layer and the strip 110-2A1 of the second cap layer 110-2, respectively. The strip 110-2A2 of the third cap layer may be electrically connected to the strip 110-2A1 of the second cap layer 110-2 through the wire layers 130 and the contacts 120, so that a plurality of resistors located in the passive element region 100B are electrically connected in series or in parallel to achieve the required resistance values for the resistor R of the semiconductor device 100.

Figure 9:
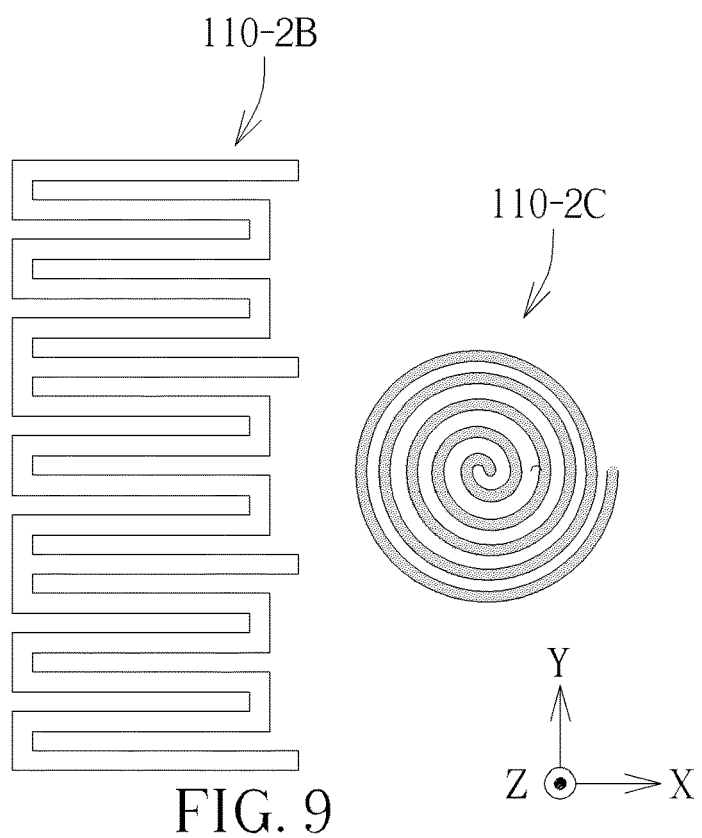
FIG. 9 is a schematic top view of resistors of a semiconductor device according to some embodiments of the present disclosure.

FIG. 9 is a schematic top view of several resistors R according to some embodiments of the present disclosure. As shown in FIG. 9, the top-view shape of the resistor R of the semiconductor device 100 may be a meander-line shape (or referred to as a square wave-like shape) 110-2B or a spiral shape 110-2C. These top-view shapes of the resistors may replace the strip shape of the resistor R as shown in FIG. 1. Moreover, the resistance value of the resistor R may be adjusted by the meandering mode and the length of the meander-line shape 110-2B or the spiral shape 110-2C to obtain various resistors with different resistance values. For example, the longer the meandering length, the resistance value of the resistor is higher. The more turning points of the meandering mode, the resistor with higher resistance value is obtained in a smaller area. In some embodiments, the composition of the resistor with the meander-line shape 110-2B or the spiral shape 110-2C may be the same as the composition of the first cap layer 110-1 in FIG. 1. These resistors with different top-view shapes may be formed simultaneously by the same epitaxial growth process and the same patterning process. In addition, multiple contacts of the resistor R may be formed directly above the resistor of the meander-line shape 110-2B or the spiral shape 110-2C. The resistor of the meander-line shape 110-2B or the spiral shape 110-2C may be electrically connected to other components, such as HEMTs, Zener diodes, and/or other components, through the multiple contacts and multiple wire layers.

Figure 10:
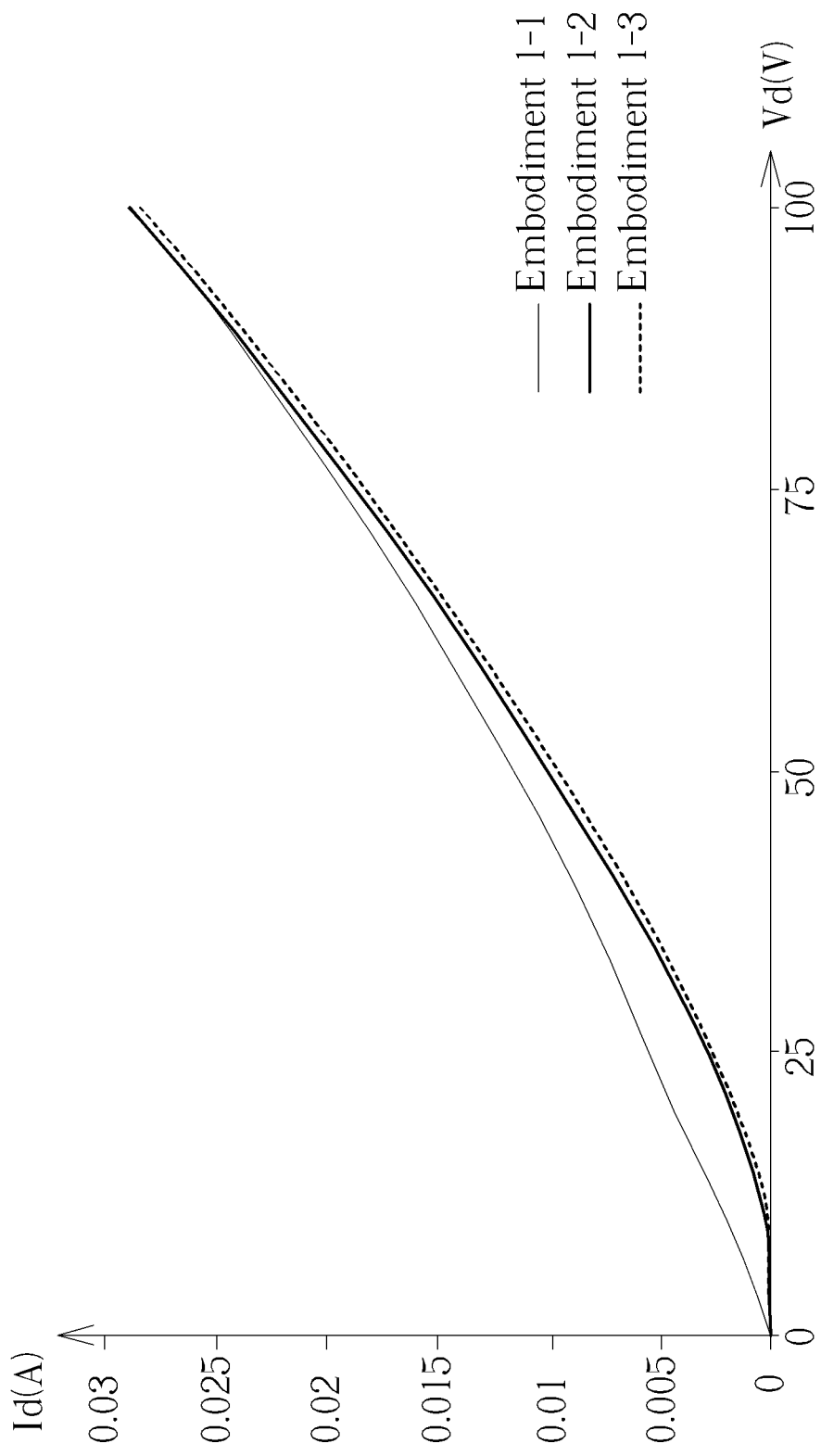
FIG. 10 is a graph showing the current versus the voltage of several resistors of a semiconductor device according to some embodiments of the present disclosure.

FIG. 10 is a graph showing the current Id versus the voltage Vd of several resistors R of semiconductor devices 100 according to some embodiments of the present disclosure. The unit of the current Id is ampere (A), and the unit of the voltage Vd is volts (V). The top-view shapes of the resistors R of the embodiments 1-1, 1-2, and 1-3 are all a strip with a length of about 23.25 micrometers (μm) and a width of about 6 μm. The resistors R of these three embodiments 1-1, 1-2 and 1-3 are manufactured simultaneously on the same wafer, and have the same size. As shown in FIG. 10, the characteristic curves of the current Id versus the voltage Vd of the resistors of the embodiments 1-1, 1-2 and 1-3 are all linear. The resistance values of these three embodiments 1-1, 1-2 and 1-3 are all approximately the same as each other. Moreover, at high voltages (such as greater than 75V), the resistance values of the three embodiments 1-1, 1-2 and 1-3 are closer to each other, which means that the resistance values of the resistors R of the semiconductor devices 100 fabricated according to the embodiments of the present disclosure are stable, and the change of the resistance values of the resistors with the voltages is linear.

According to the embodiments of the present disclosure, the compound semiconductor material for forming the cap layer of the HEMT has high resistance characteristic and is used to form the resistor in the passive element region. The resistor and the HEMT are integrated in the semiconductor device without additional processes and photo-masks. Compared with the conventional semiconductor devices using polysilicon resistors, the fabrication of the resistors of the semiconductor devices of the present disclosure is compatible with the processes of fabricating HEMTs, thereby achieving the benefits of saving process steps and manufacturing costs.

In addition, according to the embodiments of the present disclosure, resistors with different resistance values are obtained by adjusting the aspect ratio or the meandering shape of the compound semiconductor cap layer in the passive element region. According to the embodiments of the present disclosure, the resistance values of the resistors may be controlled by the high resistance characteristic of the compound semiconductor cap layer, and not be affected by the concentration of 2DEG in the channel layer of the HEMT. Therefore, the resistance values of the resistors of the present disclosure are stable and easy controlled. Moreover, the change of the resistance values of the resistor with the voltages is linear, which is conducive to the applications of high-voltage and high-power components. In addition, the resistors of the semiconductor devices of the present disclosure may be electrically connected in series and/or in parallel with HEMTs, Zener diodes and/or other components, and are suitable for applications in high-voltage and high-power AC/DC power conversion circuits and other digital logic circuits.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate, including an active element region and a passive element region;
   a compound semiconductor channel layer, a compound semiconductor barrier layer, and a first compound semiconductor cap layer, disposed in sequence on the substrate and located in the active element region;
   a gate electrode, disposed on the first compound semiconductor cap layer;
   a source electrode and a drain electrode, disposed on the compound semiconductor barrier layer, respectively located on two sides of the gate electrode to construct a high electron mobility transistor; and
   a second compound semiconductor cap layer, disposed on the substrate and located in the passive element region to construct a resistor.

2. The semiconductor device of claim 1, wherein the first compound semiconductor cap layer is extended along a first direction, the second compound semiconductor cap layer is extended along a second direction, and the first direction is different from the second direction.

3. The semiconductor device of claim 1, wherein the composition of the first compound semiconductor cap layer comprises p-type gallium nitride (GaN), and the composition of the second compound semiconductor cap layer comprises gallium nitride, p-type gallium nitride, or n-type gallium nitride.

4. The semiconductor device of claim 1, wherein the compositions of the first compound semiconductor cap layer and the second compound semiconductor cap layer comprise p-type gallium nitride (GaN) having different doping concentrations.

5. The semiconductor device of claim 1, further comprising:
a patterned conductive layer, disposed directly above the second compound semiconductor cap layer;
a first contact, disposed directly above a first portion of the patterned conductive layer and electrically connected to the second compound semiconductor cap layer and the source electrode; and
a second contact, disposed directly above a second portion of the patterned conductive layer and electrically connected to the second compound semiconductor cap layer and the drain electrode.

6. The semiconductor device of claim 1, wherein a top-view shape of the second compound semiconductor cap layer comprises a strip shape, a meander-line shape or a spiral shape.

7. The semiconductor device as claimed in claim 1, wherein the compound semiconductor channel layer and the compound semiconductor barrier layer are continuously extended from the active element region to the passive element region, and the semiconductor device further comprises an isolation region disposed in the compound semiconductor channel layer and directly under the second compound semiconductor cap layer, and a bottom surface of the isolation region is higher than or level with a bottom surface of the compound semiconductor channel layer.

8. The semiconductor device of claim 7, wherein the isolation region comprises an inert ion implantation region or a shallow trench isolation region.

9. The semiconductor device of claim 1, wherein the compound semiconductor channel layer and the compound semiconductor barrier layer have a recess in the passive element region, and the second compound semiconductor cap layer is disposed in the recess.

10. The semiconductor device of claim 9, wherein a bottom surface of the recess is higher than or level with a bottom surface of the compound semiconductor channel layer.

11. The semiconductor device of claim 1, further comprising an epitaxial stacking layer disposed between the substrate and the compound semiconductor channel layer and located in the active element region and the passive element region.

12. The semiconductor device of claim 11, wherein a bottom surface of the second compound semiconductor cap layer is in contact with a top surface of the epitaxial stacking layer.

13. The semiconductor device of claim 1, further comprising a third compound semiconductor cap layer disposed on the substrate and located in the passive element region, wherein the second compound semiconductor cap layer and the third compound semiconductor cap layer have different resistance values, and the third compound semiconductor cap layer is electrically connected to the second compound semiconductor cap layer.

14. The semiconductor device of claim 13, wherein the first compound semiconductor cap layer, the second compound semiconductor cap layer and the third compound semiconductor cap layer have the same composition.

15. A method of fabricating a semiconductor device, comprising:
providing a substrate including an active element region and a passive element region;
forming a compound semiconductor channel layer, a compound semiconductor barrier layer, and a compound semiconductor cap layer in sequence on the substrate in the active element region and the passive element region;
forming an isolation region in the compound semiconductor channel layer of the passive element region;
patterning the compound semiconductor cap layer to form a first compound semiconductor cap layer in the active element region and a second compound semiconductor cap layer in the passive element region, wherein the second compound semiconductor cap layer constructs a resistor;
forming a gate electrode on the first compound semiconductor cap layer; and
forming a source electrode and a drain electrode on the compound semiconductor barrier layer, and located on two sides of the gate electrode, respectively, to construct a high electron mobility transistor.

16. The method of claim 15, further comprising:
forming a patterned conductive layer directly above the second compound semiconductor cap layer; and
forming a first contact and a second contact directly above a first portion and a second portion of the patterned conductive layer, respectively, wherein the first contact is electrically connected to the second compound semiconductor cap layer and the source electrode, and the second contact is electrically connected to the second compound semiconductor cap layer and the drain electrode,
wherein the patterned conductive layer and the gate electrode are formed by patterning the same conductive material layer.

17. The method of claim 15, wherein forming the isolation region comprises implanting inert ions into the compound semiconductor channel layer of the passive element region to form an inert ion implantation region directly under the second compound semiconductor cap layer.

18. The method of claim 15, wherein forming the isolation region comprises etching away a portion of the compound semiconductor channel layer and a portion of the compound semiconductor barrier layer in the passive element region to form a recess, and the second compound semiconductor cap layer is formed in the recess.

19. The method of claim 15, wherein forming the isolation region comprises forming a shallow trench isolation region in the compound semiconductor channel layer and the compound semiconductor barrier layer of the passive element region, and the shallow trench isolation region is located directly under the second compound semiconductor cap layer.

20. The method of claim 15, wherein patterning the compound semiconductor cap layer further comprises forming a third compound semiconductor cap layer in the passive element region, the second compound semiconductor cap layer and the third compound semiconductor cap layer have different resistance values, and the third compound semiconductor cap layer is electrically connected to the second compound semiconductor cap layer.

\* \* \* \* \*